(12) United States Patent
Sun et al.

(10) Patent No.: US 11,251,625 B2
(45) Date of Patent: Feb. 15, 2022

(54) METHOD AND APPARATUS FOR CHARGING AND DISCHARGING

(71) Applicant: Delta Electronics,Inc., Taoyuan (CN)

(72) Inventors: Hao Sun, Taoyuan (CN); Minli Jia, Taoyuan (CN); Jinfa Zhang, Taoyuan (CN)

(73) Assignee: Delta Electronics, Inc., Taoyuan (TW)

( * ) Notice: Subject to any disclaimer, the term of this patent is extended or adjusted under 35 U.S.C. 154(b) by 392 days.

(21) Appl. No.: 16/559,733

(22) Filed: Sep. 4, 2019

(65) Prior Publication Data

US 2020/0083727 A1 Mar. 12, 2020

(30) Foreign Application Priority Data

Sep. 7, 2018 (CN) .......................... 201811045180.X
Aug. 2, 2019 (CN) .......................... 201910713081.2

(51) Int. Cl.
*H02J 7/00* (2006.01)
*H02J 9/06* (2006.01)
(Continued)

(52) U.S. Cl.
CPC .................. *H02J 7/00* (2013.01); *H02J 9/06* (2013.01); *H02M 3/33584* (2013.01); *H03K 17/693* (2013.01)

(58) Field of Classification Search
CPC ........ H02J 7/00; H02J 9/06; H02J 7/02; H02J 2207/20; H02J 2310/48; H02J 7/045;
(Continued)

(56) References Cited

U.S. PATENT DOCUMENTS 9,077,202 B1 * 7/2015 Baker ..................... H02M 7/48
2016/0121740 A1 5/2016 Zaki
(Continued)

FOREIGN PATENT DOCUMENTS

CN 102201693 A 9/2011
CN 103187779 A 7/2013
(Continued)

OTHER PUBLICATIONS

Arnaldo Arancibia et al: "A Unified Single- and Three-Phase Control for Grid Connected Electric Vehicles", IEEE Transactions on Smart Grid ,vol. 4, No. 4, Dec. 1, 2013 (Dec. 1, 2013) ,pp. 1780-1790 , XP055403240 ,USA ISSN: 1949-3053 , DOI:10.1109/TSG.2013.2271096 * the whole document *.
(Continued)

*Primary Examiner* — Stacy Whitmore
(74) *Attorney, Agent, or Firm* — Qinghong Xu

(57) ABSTRACT

The present disclosure relates to a method and apparatus for charging and discharging. The apparatus includes: an AC power terminal, including first to third nodes, and a first center line node, and being configured to receive input an AC input or send an AC output; a power conversion stage, including fourth to sixth nodes, and a second center line node; a first bus capacitor and a second bus capacitor both coupled to the second center line node, the first center line node being coupled to the second center line node; a first switch set; a second switch set; a control module, coupled to the first switch set, the second switch set, the AC power terminal, and the power conversion stage.

22 Claims, 9 Drawing Sheets

(51) Int. Cl.
*H03K 17/693* (2006.01)
*H02M 3/335* (2006.01)

(58) Field of Classification Search
CPC .... H03K 17/693; H02M 1/0074; H02M 1/10; H02M 3/33584; H02M 7/797; H02M 1/0058; H02M 1/007; H02M 1/36; H02M 3/285; H02M 7/125; Y02T 10/70; Y02T 10/7072; Y02T 10/92; Y02T 90/14; B60L 53/20
See application file for complete search history.

(56) References Cited

U.S. PATENT DOCUMENTS

| | | | |
|---|---|---|---|
| 2016/0241137 A1* | 8/2016 | Sun | H02J 4/00 |
| 2017/0179745 A1 | 6/2017 | Tritschler et al. | |
| 2018/0375326 A1* | 12/2018 | Shu | H02M 5/458 |
| 2019/0081506 A1* | 3/2019 | Chang | H02J 3/381 |
| 2021/0111642 A1* | 4/2021 | Weyh | H02M 7/483 |
| 2021/0288506 A1* | 9/2021 | Tanaka | H02M 7/5395 |
| 2021/0351597 A1* | 11/2021 | Yang | H02J 7/0063 |

FOREIGN PATENT DOCUMENTS

| | | |
|---|---|---|
| CN | 103401433 A | 11/2013 |
| CN | 204089305 U | 1/2015 |
| CN | 105189191 A | 12/2015 |
| CN | 105425066 A | 3/2016 |
| CN | 105703420 A | 6/2016 |
| CN | 105896693 A | 8/2016 |
| CN | 106716765 A | 5/2017 |
| CN | 206490487 U | 9/2017 |
| CN | 107947309 A | 4/2018 |
| EP | 2800226 A1 | 11/2014 |
| FR | 3060230 A1 | 6/2018 |
| JP | 2015208065 A | 11/2015 |
| KR | 20100019182 A | 2/2010 |
| WO | 2017076367 A1 | 5/2017 |

OTHER PUBLICATIONS

The EESR dated Dec. 13, 2019 by the EPO.
The CN1OA dated Dec. 21, 2020 by the CNIPA.
The CN1OA dated Jul. 24, 2020 by the CNIPA.

* cited by examiner

METHOD AND APPARATUS FOR CHARGING AND DISCHARGING

CROSS REFERENCE

This application is based upon and claims priority to Chinese Patent Application No. 201811045180.X, filed on Sep. 7, 2018, and Chinese Patent Applications No. 201910713081.2, filed on Aug. 2, 2019, the entire contents thereof are incorporated herein by reference.

TECHNICAL FIELD

The present disclosure relates to the technical field of power supply, and in particular, to an apparatus and a method for charging and discharging.

BACKGROUND

With the increasing popularity of electric vehicles, more and more vehicular power products are developing toward high efficiency, high power density, high reliability and low cost. At the same time, in order to reduce costs and reduce volume, power conversion stages are constantly developing toward integration.

In order to meet the high charging power demand of large-capacity electric vehicles, three-phase chargers will gradually become the mainstream of the future charging market. However, the prior three-phase charger cannot realize the charging in the single-phase power supply mode, and lacks flexibility in practical applications, which brings inconvenience to the user. At the same time, with the increase of the capacity of the electric vehicles, the excess electric energy can be used as emergency power supply on the one hand, and can also be used as the energy storage unit of the future power grid on the other hand. In the event of power grid failure, electric vehicles distributed everywhere can be used as discharge equipment for charging the power grid.

Based on the above considerations, the development of single-phase and three-phase compatible bidirectional charging and discharging equipment is the inevitable trend of the development of on board charger.

It should be noted that the information disclosed in the background section above is only for enhancing the understanding of the background of the present disclosure, and thus may include information that does not constitute prior art known to those of ordinary skill in the art.

SUMMARY

The aim of the present disclosure is to provide an apparatus and a method for charging and discharging for, at least to some extent, filling the technical blank of a bidirectional vehicle charging and discharging machine compatible with single-phase and three-phase due to limitations and drawbacks of the related art.

According to a first aspect of the embodiments of the present disclosure, there is provided an apparatus for charging and discharging, including:

an AC power terminal, including a first node, a second node, a third node, and a first center line node, configured to receive an AC input or send an AC output;

a power conversion stage, including a fourth node, a fifth node, a sixth node, and a second center line node, the first node being coupled to the fourth node by a first inductor;

a first switch set, having a first end, a second end and a third end, the first end of the first switch set being coupled to the fifth node by a second inductor, the second end of the first switch set being coupled to the first node and the third end of the first switch set being coupled to the second node;

a second switch set, having a first end, a second end and a third end, the first end of the second switch set being coupled to the sixth node by a third inductor, the second end of the second switch set being coupled to the first node and the third end of the second switch set being coupled to the third node; and a control module, coupled to the first switch set, the second switch set, the AC power terminal, and the power conversion stage.

In an exemplary embodiment of the present disclosure, the control module is configured to: when the AC power terminal receives three-phase AC input or sends three-phase AC output, control the first end of the first switch set to be coupled to the third end of the first switch set and the first end of the second switch set to be coupled to the third end of the second switch set; and when the AC power supply terminal receives single-phase AC input or single-phase AC output, control the first end of the first switch set to be coupled to the second end of the first switch set, and control the first end of the second switch set to be disconnected with the third end of the second switch set.

In an exemplary embodiment of the present disclosure, the apparatus for charging and discharging further includes:

a third switch set, including a first end and a second end, the first end of the third switch set being coupled to the first center line node, and the second end of the third switch set being coupled to the second center line node.

In an exemplary embodiment of the present disclosure, the first switch set includes a single-pole double-throw switch, a double-pole double-throw switch, two semiconductor switches or two relays.

In an exemplary embodiment of the present disclosure, the power conversion stage includes:

an AC/DC converter, including a first bridge arm coupled to the fourth node, a second bridge arm coupled to the fifth node, and a third bridge arm coupled to the sixth node, a first end of the first bridge arm, a first end of the second bridge arm, and a first end of the third bridge arm all being coupled to a seventh node, and a second end of the first bridge arm, a second end of the second bridge arm, and a second end of the third bridge arm all being coupled to an eighth node;

a first bus capacitor, coupled to the seventh node and the second center line node;

a second bus capacitor, coupled to the eighth node and the second center line node; and a Direct Current (DC)/DC converter, coupled to the seventh node and the eighth node.

In an exemplary embodiment of the present disclosure, the AC/DC converter and the DC/DC converter are bidirectional converter.

In an exemplary embodiment of the present disclosure, the DC/DC converter includes a resonant circuit, the resonant circuit includes a primary circuit, a resonant tank, and a secondary circuit, both the primary circuit and the secondary circuit are full bridge circuits, and the resonant tank includes a transformer, at least one inductor and at least one capacitor.

In an exemplary embodiment of the present disclosure, the power conversion stage includes:

an AC/DC converter, including a first bridge arm coupled to the fourth node, a second bridge arm coupled to the fifth node, and a third bridge arm coupled to the sixth node, a first end of the first bridge arm, a first end of the second bridge arm, and a first end of the third bridge arm all being coupled to the seventh node, and second ends of the first bridge arm, the second bridge arm, and the third bridge arm all being coupled to the eighth node;

a first bus capacitor, coupled to the seventh node and the second center line node;

a second bus capacitor, coupled to the eighth node and the second center line node;

a first DC/DC converter, in parallel with the first bus capacitor;

a second DC/DC converter, in parallel with the second bus capacitor.

In an exemplary embodiment of the present disclosure, the power conversion stage further includes: a switch bridge arm, in parallel with the second bus capacitor, including a first resistor and a fourth switch set coupled to each other, the fourth switch set being coupled to the control module, and being turned on or turned off in response to a first control signal formed by the control module according to an operation mode of the apparatus for charging and discharging; and a fifth switch set, coupled to the control module, having a first end, a second end and a third end, the first end of the fifth switch set being coupled to the first center line node, the second end of the fifth switch set being coupled to the sixth node or coupled to the sixth node by the third inductor, the third end of the fifth switch set being coupled to the second center line node, and the first end of fifth switch set being selectively coupled to the second end of the fifth switch set or the third end of the fifth switch set in response to a second control signal formed by the control module according to the operation mode of the apparatus for charging and discharging.

In an exemplary embodiment of the present disclosure, at least one of the first DC/DC converter and the second DC/DC converter is a bidirectional DC/DC converter and the AC/DC converter is a bidirectional AC/DC converter.

In an exemplary embodiment of the present disclosure, the apparatus for charging and discharging further includes:

a sixth switch set, coupled to the control module and having a first end and a second end, the first end of the sixth switch set being coupled to the first node, the second end of the sixth switch set being coupled to the fourth node by the first inductor, and the sixth switch set being selectively turned on or turned off in response to a pre-charge control signal sent by the control module according to a pre-charge requirement; and a second resistor, in parallel with the sixth switch set.

According to a second aspect of the embodiments of the present disclosure, there is provided a method for charging and discharging, applied to an apparatus for charging and discharging, wherein the apparatus for charging and discharging includes: an AC power terminal, a first node, a second node, a third node, and a first center line node configured to receive an AC input or send AC output; a power conversion stage, including a fourth node, a fifth node, a sixth node, and a second center line node, the first node being coupled to the fourth node by a first inductor; a first switch set, having a first end, a second end and a third end, and the first end of the first switch set being coupled to the fifth node by a second inductor, the second end of the first switch set being coupled to the first node, and the third end of the first switch set being coupled to the second node; and a second switch set, having a first end, a second end and a third end, and the first end of the second switch set being coupled to the sixth node by a third inductor, the second end of the second switch set being coupled to the first node, and the third end of the second switch set being coupled to the third node; wherein, the method includes:

determining whether an operation mode is a three-phase mode or a single-phase mode;

in the three-phase mode, controlling the first end of the first switch set to be coupled to the third end of the first switch set and the first end of second switch set to be coupled to the third end of second switch set; and in the single-phase mode, controlling the first end of the first switch set of the apparatus for charging and discharging to be coupled to the second end of the first switch set, and controlling the first end of the second switch set to be disconnected with the second end of the second switch.

In an exemplary embodiment of the present disclosure, the power conversion stage includes:

an AC/DC converter, including a first bridge arm coupled to the fourth node, a second bridge arm coupled to the fifth node, and a third bridge arm coupled to the sixth node, a first end of the first bridge arm, a first end of the second bridge arm, and a first end of the third bridge arm all being coupled to the seventh node, and a second end of the first bridge arm, a second end of the second bridge arm, and a second end of the third bridge arm all being coupled to the eighth node;

a first bus capacitor, coupled to the seventh node and the second center line node;

a second bus capacitor, coupled to the eighth node and the second center line node; and a DC/DC converter, coupled to the seventh node and the eighth node.

In an exemplary embodiment of the present disclosure, the AC/DC converter and the DC/DC converter are bidirectional converter.

In an exemplary embodiment of the present disclosure, the DC/DC converter includes a resonant circuit, a resonant circuit includes a primary circuit, a resonant tank, and a secondary circuit, both the primary circuit and the secondary circuit are full bridge circuits, and the resonant tank includes a transformer, at least one inductor and at least one capacitor.

In an exemplary embodiment of the present disclosure, the apparatus for charging and discharging further includes a third switch set coupled to the first center line node and the second center line node.

In an exemplary embodiment of the present disclosure, the first switch set and the second switch set includes a single-pole double-throw switch, a double-pole double-throw switch, two semiconductor switches or two relays.

In an exemplary embodiment of the present disclosure, the power conversion stage includes: a first bridge arm coupled to the fourth node, a second bridge arm coupled to the fifth node, a third bridge arm coupled to the sixth node, a seventh node coupled to a first end of the first bridge arm, a first end of the second bridge arm, and a first end of the third bridge arm, an eighth node coupled to a second end of the first bridge arm, a second end of the second bridge arm, and a second end of the third bridge arm, a first bus capacitor coupled to the seventh node and the second center line node, a second bus capacitor coupled to the eighth node and the second center line node, a first DC/DC converter in parallel with the first bus capacitor, a second DC/DC converter in parallel with the second bus capacitor.

In an exemplary embodiment of the present disclosure, the power conversion stage further includes: a switch bridge arm in parallel with the second bus capacitor, wherein the switch bridge arm includes a first resistor and a fourth switch set coupled to each other, the fourth switch set is coupled to the control module, the apparatus for charging and discharging further includes: a fifth switch set coupled to the control module and having a first end, a second end and a third end, and the first end of the fifth switch set is coupled to the first center line node, the second end of the fifth switch set being coupled to the sixth node or coupled to the sixth node by the third inductor, the third end of the fifth switch set being coupled to the second center line node, wherein, the method includes:

in a three-phase mode, controlling the fourth switch set to be turned off, and controlling the first switch set and the second switch set according to an operation mode of the apparatus for charging and discharging; and in a single-phase mode, controlling the fourth switch set to be turned on, controlling a front stage of the second DC/DC converter to be conducted after a preset time, and controlling the first switch set and the second switch set according to the operation mode of the apparatus for charging and discharging.

In an exemplary embodiment of the present disclosure, the method further includes:

in the three-phase mode, controlling the first end of the fifth switch set to be coupled to the third end of the fifth switch set; and in the single-phase charging mode or the single-phase discharging mode, controlling the first end of the fifth switch set to be coupled to the second end of the fifth switch set.

In an exemplary embodiment of the present disclosure, the apparatus for charging and discharging further includes: a sixth switch set and a second resistor connected in parallel with the sixth switch set, wherein the sixth switch set has a first end and a second end, the first end of the sixth switch set is coupled to the first node, the second end of the sixth switch set being coupled to the fourth node by the first inductor, and a capacitor formed by the first bus capacitor and the second bus capacitor connected in series is a bus capacitor; wherein, before determining whether the charging mode is the three-phase mode or the single-phase mode, the method further includes:

disconnecting the first end of the first switch set with the second end and the third end of the first switch, the first end of the second switch set with the second end and the third end of the second switch, and turning off the sixth switch set, and pre-charging the bus capacitor by the second resistor; turning on the sixth switch set when a voltage on the bus capacitor reaches a first predetermined voltage; and determining whether the charging mode is the three-phase charging mode or the single-phase charging mode when the voltage on the bus capacitor reaches a second preset voltage.

The apparatus and method for charging and discharging provided by the embodiments of the present disclosure can realize single-phase and three-phase charging as well as single-phase and three-phase discharging by setting a switch set corresponding to each phase of power source and adjusting a connection mode of each switch set according to an operation mode. In addition, it is possible to adapt to high and low power charging modes by setting parallel DC/DC modules, which can effectively avoid the waste of resources and save costs.

It is to be understood that both the foregoing general description and the following detailed description are exemplary only and are not restrictive of the present disclosure.

BRIEF DESCRIPTION OF THE DRAWINGS

The accompanying drawings, which are incorporated in and constitute a part of this specification, illustrate embodiments consistent with the present disclosure, and together with the description, serve to explain the principles of the present disclosure. The drawings in the following description are merely some embodiments of the present disclosure, and for those skilled in the art, other drawings may also be obtained based on these drawings without creative labor.

DETAILED DESCRIPTION

Figure 1A:
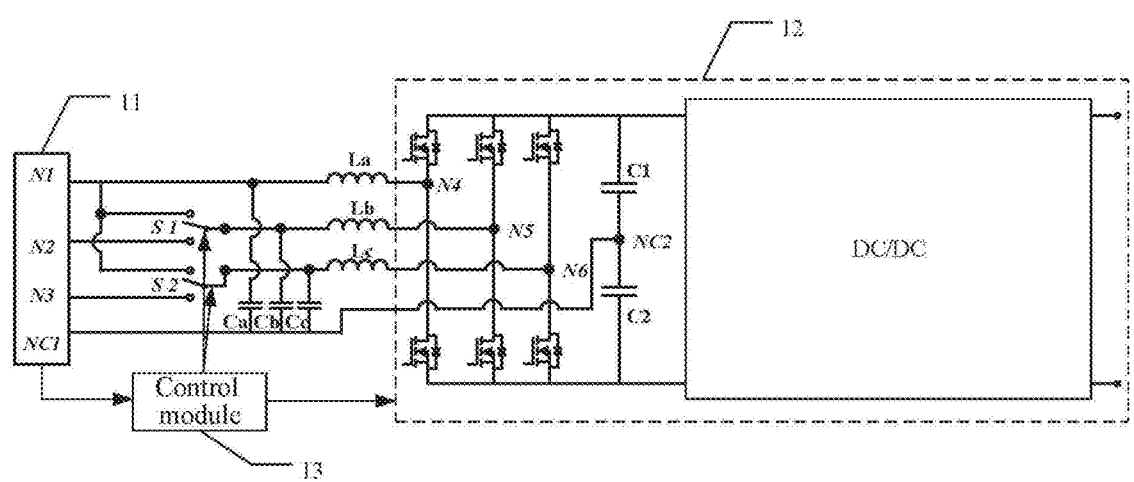
FIG. 1A and FIG. 1B are block diagrams of an apparatus for charging and discharging according to an exemplary embodiment of the present disclosure.

Exemplary embodiments will now be described more fully with reference to the accompanying drawings. However, the exemplary embodiments may be implemented in many forms and should not be construed as being limited to the embodiments set forth herein; instead, these embodiments are provided so that this disclosure will be thorough and complete, and the concepts of the exemplary embodiments will be comprehensively conveyed to those skilled in the art. Furthermore, the described features, structures, or characteristics may be combined in one or more embodiments by using any suitable manner. In the following description, numerous specific details are set forth to provide full understanding of the embodiments of the present disclosure. However, those skilled in the art should appreciate that the technical solutions of the present disclosure may be practiced without one or more of the foregoing specific details, or other methods, constituent element, materials, devices, steps, etc. may be adopted. In other instances, well-known structures, methods, apparatuses, implementations, materials, or operations are not shown or described in detail to avoid obscuring various aspects of the present disclosure.

Further, the drawings are only schematic illustrations of the present disclosure, the same reference numerals are used to refer to the same or similar parts in the drawings, and the repeated description thereof will be omitted. The block diagrams shown in the drawings are merely functional entities and do not have to correspond to physically separate entities. That is, these functional entities may be implemented in software form, or these functional entities may be implemented in one or more hardware modules or integrated circuits, or these function entities may be implemented in different networks and/or processor devices and/or microcontroller devices.

The exemplary embodiments of the present disclosure will be described in detail below with reference to the accompanying drawings.

Figure 1B:
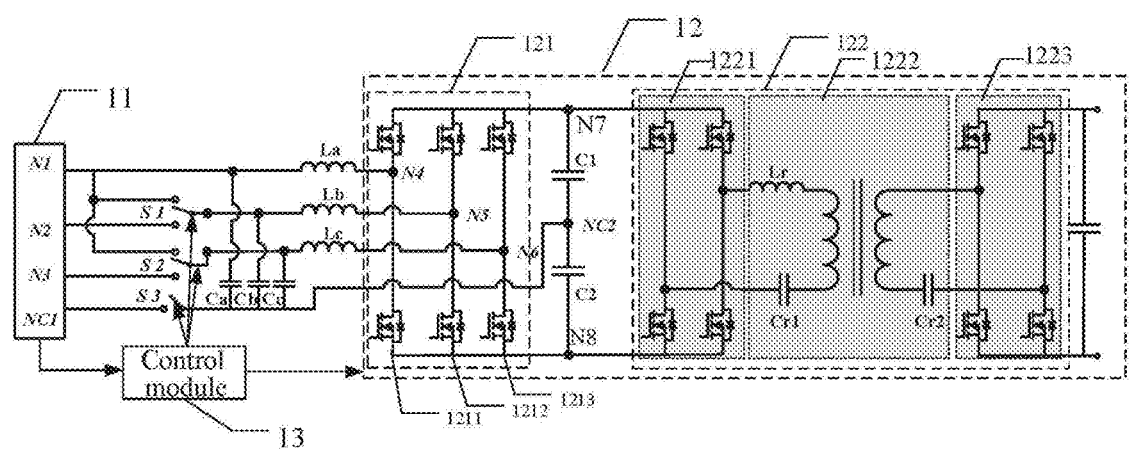

FIG. 1A and FIG. 1B are block diagrams of an apparatus for charging and discharging according to an exemplary embodiment of the present disclosure.

With reference to FIG. 1A, the apparatus for charging and discharging may include:

an AC power terminal 11, including a first node N1, a second node N2, a third node N3, and a first center line node NC1, and configured to receive an AC input or send an AC output;

a power conversion stage 12, including a fourth node N4, a fifth node N5, a sixth node N6, and a second center line node NC2, the first node N1 being coupled to the fourth node N4 by a first inductor La;

a first switch set S1, including a first end, a second end and a third end, the first end of the first switch set being coupled to the fifth node N5 by a second inductor Lb, the second end of the first switch set being coupled to the first node N1 and the third end of the first switch set being coupled to the second node N2;

a second switch set S2, including a first end, a second end and a third end, the first end of the second switch set being coupled to the sixth node N6 by a third inductor Lc, the second end of the second switch set being coupled to the first node N1 and the third end of the second switch set being coupled to the third node N3;

a control module 13, coupled to the first switch set S1, the second switch set S2, the AC power terminal 11, and the power conversion stage 12.

With reference to FIG. 1B, in an exemplary embodiment of the present disclosure, the apparatus for charging and discharging may further include:

a third switch set S3, coupled to the control module 13, including a first end and a second end, the first end thereof being coupled to the first center line node NC1, and the second end thereof being coupled to the second center line node NC2, wherein the third switch set may be turned on or turned off according to a control signal of the control module 13 to control a connection between the first center line node NC1 and the second center line node NC2.

In the embodiment shown in FIG. 1A or FIG. 1B, the first switch set S1 and the second switch set S2 may include a single-pole double-throw switch, a double-pole double-throw switch, two semiconductor switches or two relays. The control module 13 is configured to: control the first end of the first switch set S1 to be coupled to the third end (the second node N2) of the first switch set S1 and the first end of the second switch set S2 to be coupled to the third end (the third node N3) of the second switch set S2; when the AC power terminal receives three-phase AC input or sends three-phase AC output; and control the second end of the first switch set S1 to be coupled to the second end (the first node N1) of the first switch set S1, and the first end of the second switch set S2 to be disconnected with the third end (the third node N3) of the second switch set S2, when the AC power terminal 11 receives single-phase AC input or single-phase AC output, which includes two conditions in which the first end of the second switch set S2 is coupled to or disconnected with the second end of the second switch set S2.

In some embodiments, the AC power terminal 11 further includes a current communication interface coupled to the control module 13, and the current communication interface is configured to provide a maximum charging current value to the control module 13 through a preset communication manner. When the AC power terminal 11 is used for inputting the single-phase AC power, and the maximum charging current value is determined to be within a first preset current range according to the information of the current communication interface, the control module 13 may control the first switch set S1 and the second switch set S2 to be tuned off; when it is determined that the maximum charging current value is within a second preset current range, the control module 13 may control the first end of the first switch set S1 to be coupled to the second end (the first node N1), and the second switch set to be turned off, and when it is determined that the maximum charging current value is within a third preset current range, the control module 13 may control the first end of the first switch set S1 to be coupled to the second end (the first node N1) of the first switch set S1, and the first end of the second switch set S2 to be coupled to the second end (the first node N1) of the second switch set S2. The maximum current value of the first preset current range is smaller than the minimum current value of the second preset current range, and the maximum current value of the second preset current range is smaller than the minimum current value of the third preset current range.

The manner of controlling the first switch set and the second switch set by the control module 13 may be determined according to specific conditions, which is not limited here.

In addition, in the embodiment shown in FIG. 1B, the power conversion stage 12 further includes:

an AC/DC converter 121, including a first bridge arm 1211 coupled to the fourth node N4, a second bridge arm 1212 coupled to the fifth node N5, and a third bridge arm 1213 coupled to the sixth node N6, first ends of the first bridge arm, the second bridge arm, and the third bridge arm being coupled to a seventh node N7, and second ends of the first bridge arm, the second bridge arm, and the third bridge arm being coupled to an eighth node N8;

a first bus capacitor C1, coupled to the seventh node N7 and the second center line node NC2;

a second bus capacitor C2, coupled to the eighth node N8 and the second center line node NC2; and a DC/DC converter 122, coupled to the seventh node N7 and the eighth node N8.

The DC/DC converter 122 includes a resonant circuit, the resonant circuit includes a primary circuit 1221, a resonant tank 1222, and a secondary circuit 1223, both the primary circuit and the secondary circuit are full bridge circuits, and the resonant tank includes a transformer, a resonant inductor Lr, a primary side resonant capacitor Cr1 and a secondary side resonant capacitor Cr2.

In some embodiments, the AC/DC converter and the DC/DC converter are bidirectional converter.

The control module 13 is coupled to switches of each bridge arm of the AC/DC converter 121 and the DC/DC converter 122 to control the switching states of the switches of each bridge arm of the AC/DC converter 121 and the DC/DC converter 122 to make the power conversion stage 12 achieve the corresponding working mode, when it is determined that the AC power terminal 11 is used for single-phase charging, single-phase discharging, three-phase charging or three-phase discharging.

In some embodiments, a portion of the control module 13 that controls the switches of the bridge arms of the AC/DC converter 121 and the DC/DC converter 122 may be disposed in the same hardware package with the power conversion stage 12, and this portion is connected to other parts of the control module 13 via a signal line. The specific hardware setting of the control module 13 is not specifically limited in the present disclosure.

Figure 2:
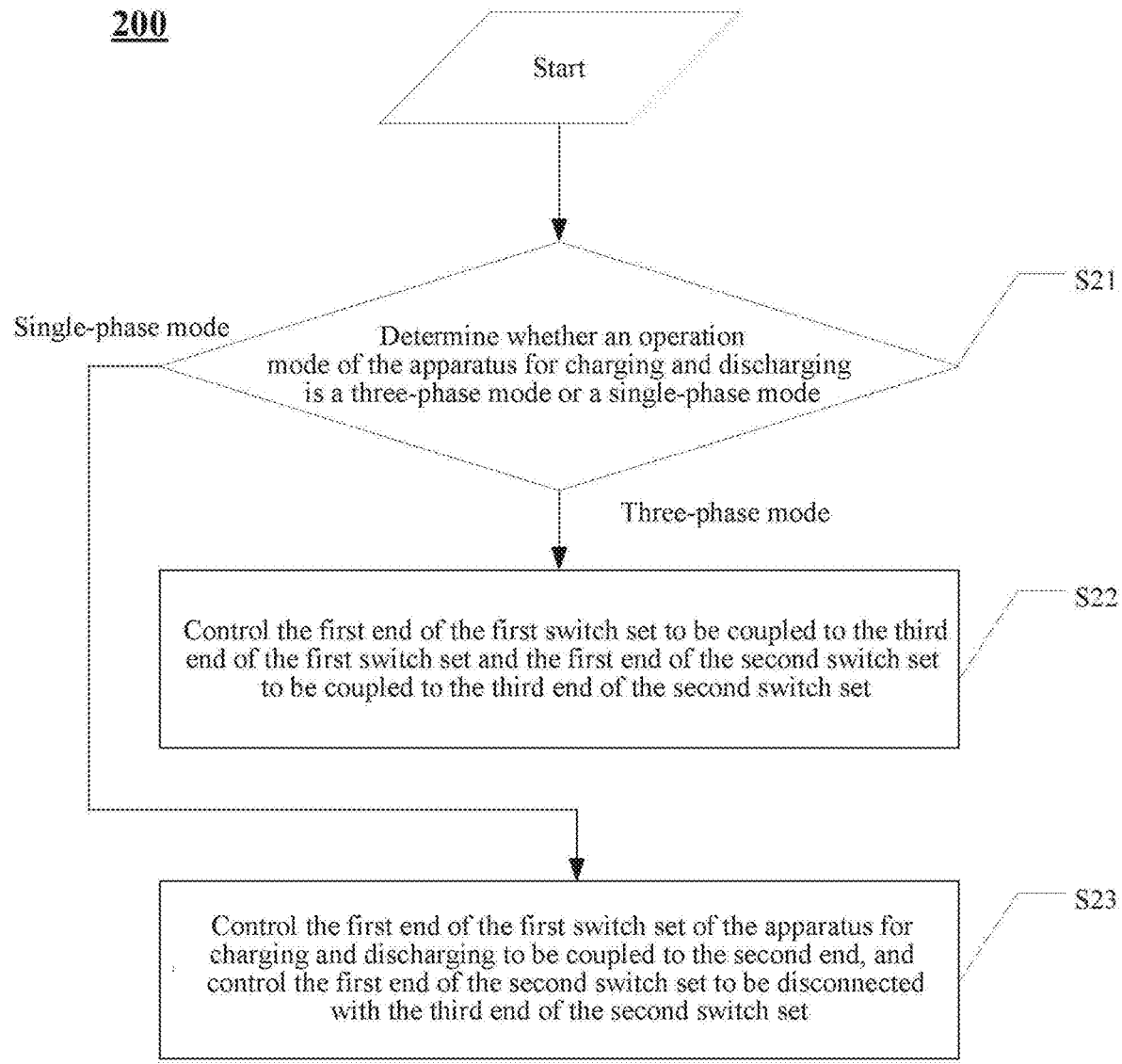
FIG. 2 is a flow chart of a method for charging and discharging corresponding to FIG. 1A or FIG. 1B according to an exemplary embodiment of the present disclosure.

FIG. 2 is a flow chart of a method for charging and discharging according to an exemplary embodiment of the present disclosure. The method for charging and discharging 200 may be applied in the apparatus for charging and discharging shown in FIG. 1A or FIG. 1B.

With reference to FIG. 2, the method for charging and discharging 200 may include the following steps.

In step S21, it is determined whether an operation mode of the apparatus for charging and discharging is a single-phase mode or a three-phase mode.

In step S22, in the three-phase mode, the first end of the first switch set S1 is controlled to be coupled to the third end (the second node N2) of the first switch set S1 and the first end of the second switch set S2 to be coupled to the third end (the third node) of the second switch set S2.

In step S23, in the single-phase mode, the first end of the first switch set of the apparatus for charging and discharging is controlled to be coupled to the second end (the first node N1) of the first switch set S1, and the first end of the second switch set S2 is controlled to be disconnected with the third end (the third node N3) of the second switch set S2.

The determination of the working mode may be implemented by the control module through a signal indicating the working mode in a detecting system. Similarly, the determination of the charging mode may be implemented by the control module through a signal indicating the charging mode in the detecting system. In addition, the determination of the working mode or the charging mode may also be implemented by a combination of hardware and software in the system directly, which may be set by those skilled in the art according to the actual situation, and the present disclosure is not limited thereto.

In the three-phase working mode, by controlling the first end of the first switch set S1 to be coupled to the third end of the first switch set S1 (the second node N2), controlling the first end of the second switch set S2 to be coupled to the third end of the second switch set S2 (the third node N3), and controlling the third switch set S3 to be turned off if the third switch set S3 is provided, a normal three-phase charging circuit may be realized, which may achieve three-phase charging with a maximum power of approximately 11 kW or a three-phase discharging with a maximum power of approximately 11 kVA.

In the single-phase working mode, by controlling the first end of the first switch set S1 to be coupled to the second end of the second switch set S1 (the first node N1) and the second switch set S2 to be coupled to or disconnected with the second end of the second switch set S2 (the first node N1), and controlling the third switch set S3 to be turned off if the third switch set S3 is provided, a single-phase charging with a maximum power of approximately 7.2 kW or 11 kVA or a single-phase discharge with a maximum power of approximately 7.2 kVA or 11 kVA may be achieved.

In some embodiments, it may be determined whether the first end of the first switch set S1 or the second switch set S2 is coupled to the second end of the first switch set S1 or the second switch set S2 or not according to the maximum value of the charging current, and if the maximum value of the charging current is less than the first preset value, the second switch set S2 may be controlled to be turned off, or the first end of the first switch set S1 is controlled to be coupled with the second end (N1), or the first switch set S1 may be controlled to be turned off and the first end of the second switch set S2 to be coupled to the second end (N1), and controlling the third switch set S3 to be turned off if the third switch set S3 is provided, thereby achieving single-phase charging and discharging with a power of about 7.2 kW through two nodes (N4 and N5, or N4 and N6).

In some other embodiments, if the maximum value of the charging current is greater than the second preset value (the second preset value is greater than the first preset value), the first end of the second switch set S2 may be controlled to be coupled to the second end of the second switch set S2 (N1), and controlling the third switch set S3 to be turned off if the third switch set S3 is provided, thereby, single-phase charging is realized through three nodes N4, N5 and N6, and single-phase charging with a maximum power of about 11 kW is realized.

In another embodiment, when it is in the single-phase discharging mode, the first end of the first switch set S1 is controlled to be coupled to the second end of the first switch set S1 and the first end of the second switch set S2 is controlled to be coupled to the second end of the second switch set S2, so as to achieve single-phase discharge with a maximum power of about 11 kVA.

The above first preset value and the second preset value may be set according to the system condition, and the present disclosure is not limited thereto.

In the embodiment shown in FIG. 1A and FIG. 1B, the apparatus for charging and discharging includes only one DC/DC converter, and this arrangement may satisfy the charge and discharge of the bus voltage of 800V. However, in practical applications, the single-phase bus voltage is mostly 400V. For convenience of design, the embodiments of the present disclosure also provide a scheme for charging and discharging that may adapt to two bus voltages.

Figure 3A:
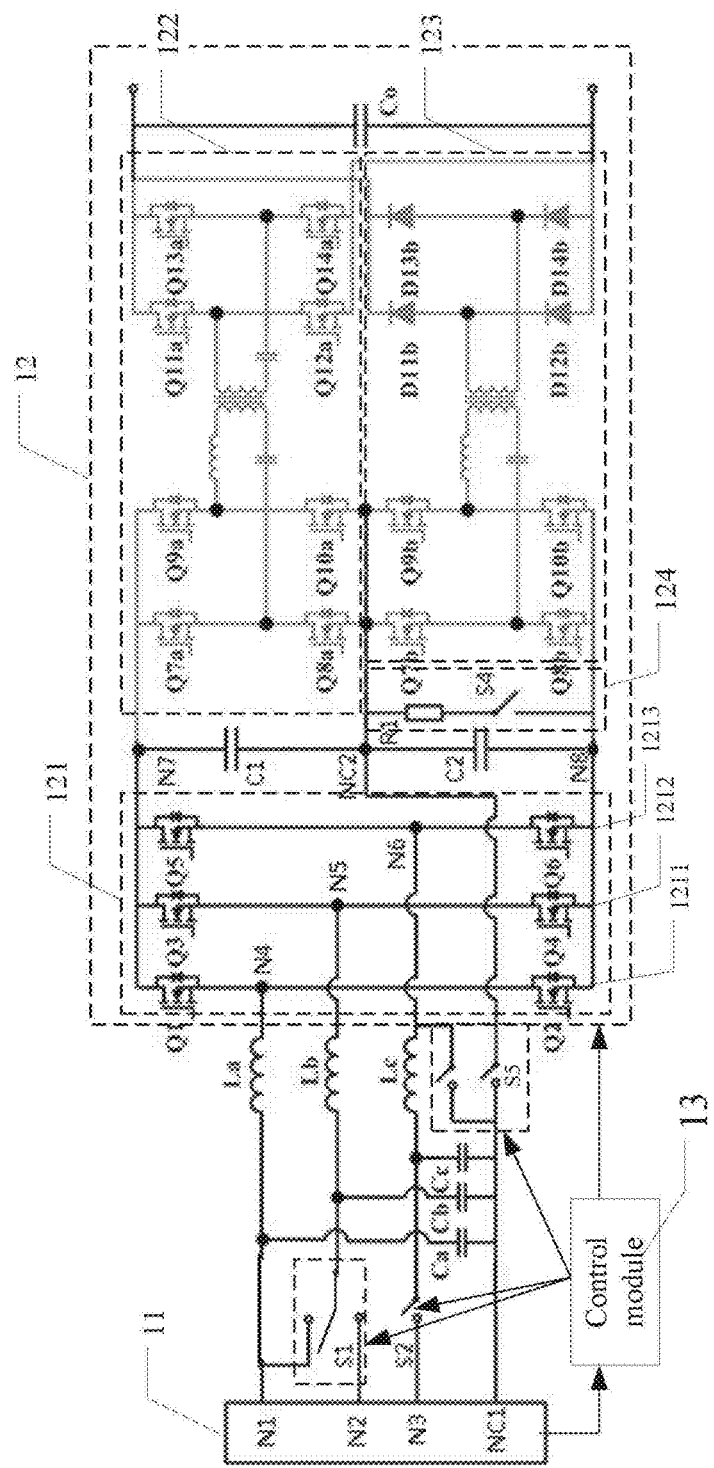
FIGS. 3A and 3B is block diagrams of an apparatus for charging and discharging according to an another exemplary embodiment of the present disclosure.

FIG. 3A is block diagram of a circuit of a power conversion stage according to one embodiment of the present disclosure.

With reference to FIG. 3A, in an exemplary embodiment of the present disclosure, a power conversion stage 12 may include:

an AC/DC converter 121, including a first bridge arm 1211 coupled to the fourth node N4, a second bridge arm 1212 coupled to the fifth node N5, and a third bridge arm 1213 coupled to the sixth node N6, first ends of the first bridge arm, the second bridge arm, and the third bridge arm being all coupled to the seventh node N7, and the second end thereof being all coupled to the eighth node N8;

a first bus capacitor C1 coupled to the seventh node N7 and the second center line node NC2;

a second bus capacitor C2 coupled to the eighth node N8 and the second center line node NC2;

a first DC/DC converter 122 in parallel with the first bus capacitor C1;

a second DC/DC converter 123 in parallel with the second bus capacitor C2; and a switch bridge arm 124 in parallel with the second bus capacitor C2, including a first resistor R1 and a fourth switch set S4 coupled to each other, the fourth switch set S4 being coupled to the control module, and being turned on or turned off in response to a first control signal formed by the control module according to an operation mode of the apparatus for charging and discharging.

Similar to the embodiment shown in FIG. 1B, the control module 13 is coupled to the switches of each bridge arm of the AC/DC converter 121 to control switching states of the switches of each bridge arm of the AC/DC converter 121 and the DC/DC converters 122 when the AC power terminal 11 is used for single-phase charging, single-phase discharging, three-phase charging, or three-phase discharge, so that the power conversion stage 12 realizes the corresponding operation mode.

In some embodiments, a portion of the control module 13 that controls the switches of each bridge arm of the AC/DC converter 121 and the DC/DC converter 122 as well as the power conversion stage 12 may be disposed in the same hardware package, and this portion is connected to other parts of the control module 13 via a signal line. The specific hardware setting of the control module 13 is not specifically limited in the present disclosure.

In the embodiment shown in FIG. 3A, the apparatus 1 for charging and discharging may further include:

a fifth switch set S5, coupled to the control module 13, and including a first end, a second end and a third end, wherein the first end thereof is coupled to the first center line node NC1, and the second end thereof is coupled to the sixth node N6, the third end thereof is coupled to the second center line node NC2, and the first end of the fifth switch set S5 is selectively coupled to the second end (N6) or the third end (NC2) in response to a second control signal formed by the control module 13 according to the operation mode of the apparatus for charging and discharging.

In an exemplary embodiment of the present disclosure, at least one of the first DC/DC converter 122 and the second DC/DC converter 123 is a bidirectional DC/DC converter. The two DC/DC converters may be connected by connecting inputs in series and connecting outputs in parallel.

Figure 3B:
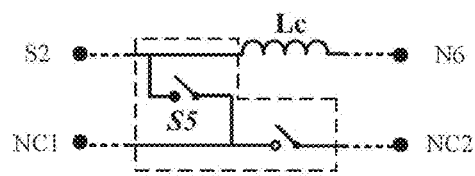

FIG. 3B illustrates another connection manner of the fifth switch group shown in FIG. 3A.

Referring to FIG. 3B, in some embodiments, the second end of the fifth switch group S5 may also be coupled to the sixth node N6 via a third inductance Lc. In the embodiment shown in FIG. 3B, when the working mode is single-phase, by controlling the first end and the second end of the fifth switching group to be connected, the first arm 1211 and the third arm 1213 can operate in a full-bridge mode, thus achieving a frequency doubling effect at the single-phase AC side.

It is understandable that the connection manner of the fifth switch group S5 shown in FIGS. 3A and 3B may be applied not only to the circuit shown in FIG. 3A, but also to the circuit shown in FIG. 1B or other embodiments of the present disclosure.

Figure 4:
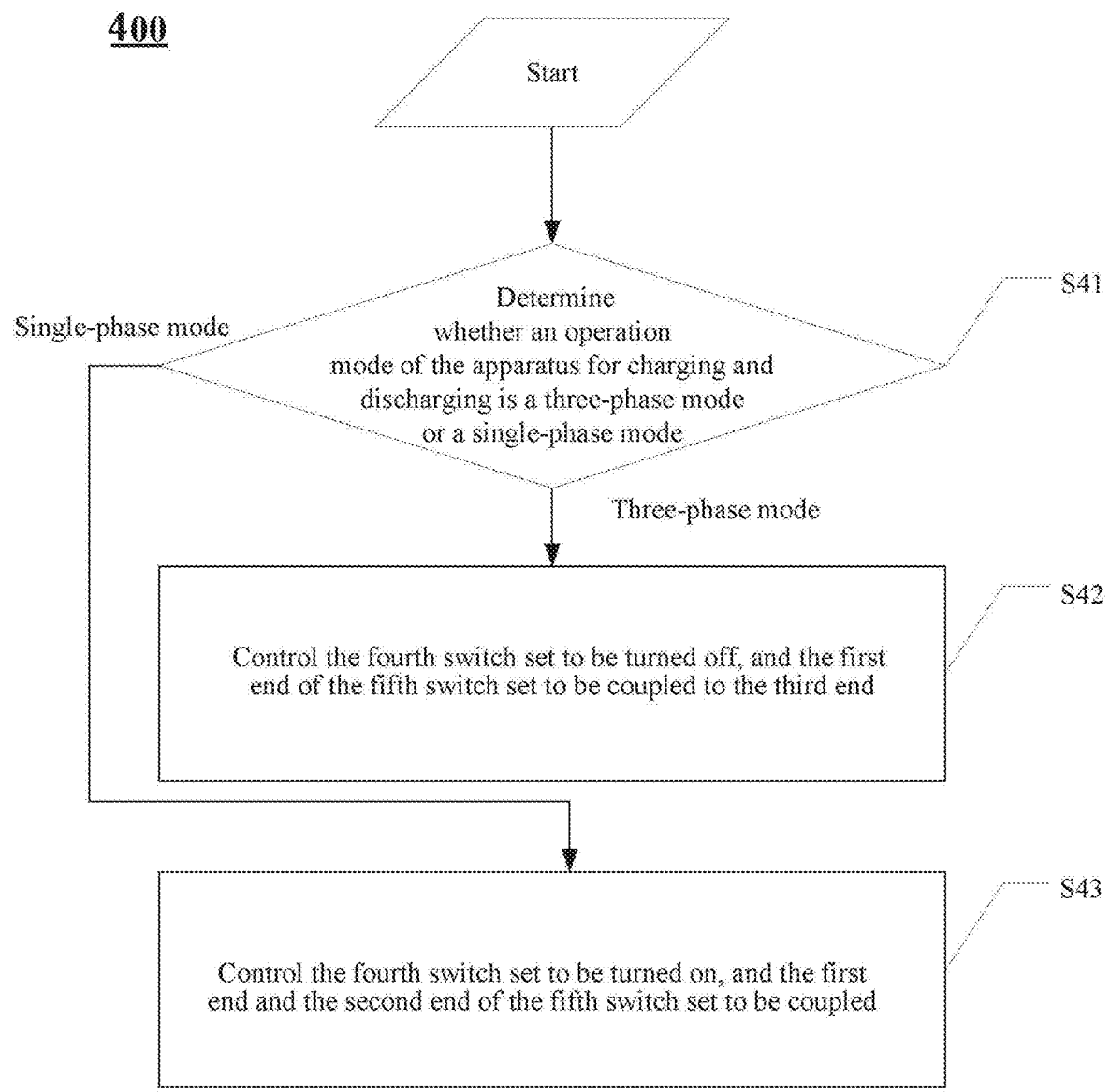
FIG. 4 is a flow chart of a method for charging and discharging corresponding to FIG. 3 according to an exemplary embodiment of the present disclosure.

FIG. 4 is a flow chart of a method for charging and discharging according to an embodiment of the present disclosure. The method for charging and discharging 400 shown in FIG. 4 may be applied to the apparatus for charging and discharging shown in FIGS. 3A and 3B.

With reference to FIG. 4, the method for charging may include the following steps.

In step S41, it is determined whether an operation mode of the apparatus for charging and discharging is a three-phase mode or a single-phase mode.

In step S42, in the three-phase mode, the fourth switch set S4 is controlled to be turned off, and the first end of the fifth switch set S5 is controlled to be coupled to the third end (the second center line node NC2).

In step S43, in the single-phase mode, the fourth switch set S4 is controlled to be turned on, the first end and the second end (the sixth node N6) of the fifth switch set S5 are controlled to be coupled.

The primary side switches of the second DC/DC converter 123 is controlled to be turned on after a preset time.

At this time, the three bridge arms 1211, 1212, and 1213 work together to charge the bus capacitors C1 and C2, and may operate in an environment with a bus voltage up to 800V.

During the three-phase charge and discharge, the first end of the fifth switch set S5 is coupled to the third end of the fifth switch set S5, the second center line node NC2 is coupled to the first center line node NC1, and the apparatus for charging and discharging operates in an environment with a bus voltage of 800V. At this time, the fourth switch set S4 is turned off, the two DC/DC converters work at the same time, and respectively receive 400V voltage from the 800V bus voltage for operation. At the same time, the second end of the first switch set S1 is connected to the second node N2, and the second switch set S2 is turned on.

During the single-phase charge and discharge, the first end of the fifth switch set S5 is coupled to second end of the fifth switch set S5, and the first end of the first switch set S1 is coupled to the second end of the first switch set S1, so that the current of the first node N1 enters the first DC/DC converter 122 through the fourth node N4 and the fifth node N5, and returns to the first center line node NC1 through the sixth node N6. The AC/DC converter 121 may be equivalent to a full bridge circuit, at this time, the turn-on and turn-off of the fourth switch set S4 may be controlled, so as to control the connection and disconnection of the second DC/DC converter 123. For example, the fourth switch set S4 may be turned on first, the residual voltage in the second bus capacitor C2 is discharged through the first resistor R1, and then the primary switches Q7b, Q8b, Q9b, Q10b in the second DC/DC converter 123 are controlled to be turned on, and the second bus capacitor C2 and the first resistor R1 are short-circuited, so that the detachment of the second DC/DC converter 123 may be realized.

In the embodiment shown in FIG. 3, the circuits and components of the first DC/DC converter 122 and the second DC/DC converter 123 may be designed and selected according to an operating voltage of the bus voltage of 400 V, thereby greatly saving the manufacturing costs.

In addition, by only setting the first DC/DC converter 122 to operate during the single-phase charge with the bus voltage of 400V, it is also possible to improve efficiency and optimize control.

In some embodiments, the switch bridge arm 124 may also be connected in parallel with the first bus capacitor C1 and the first DC/DC converter 122, so as to control the connection and disconnection of the first DC/DC converter 122.

Figure 5A:
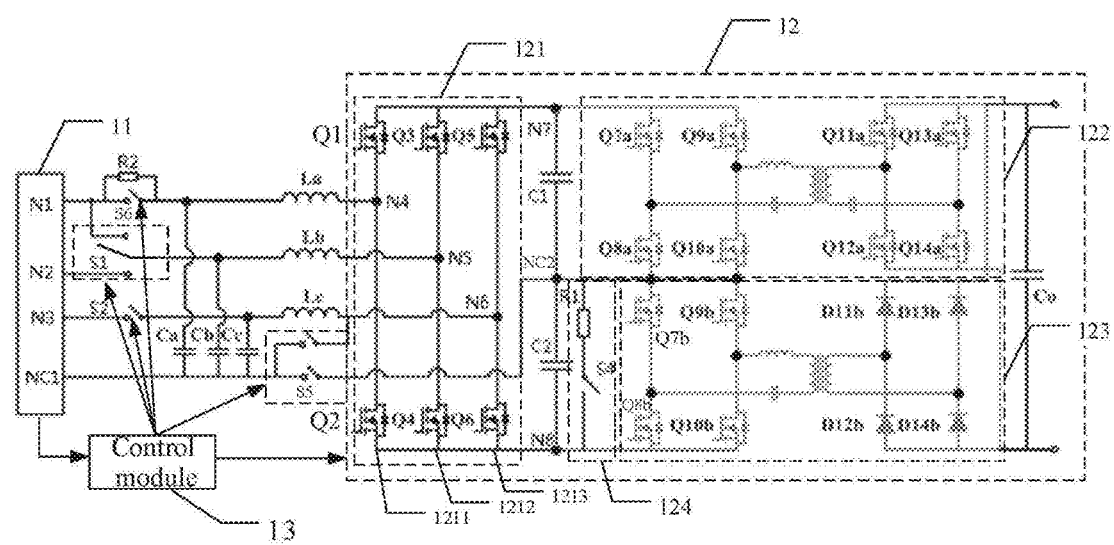
FIG. 5A and FIG. 5B are block diagrams of a circuit of an apparatus for charging and discharging according to an exemplary embodiment of the present disclosure.
Figure 5B:
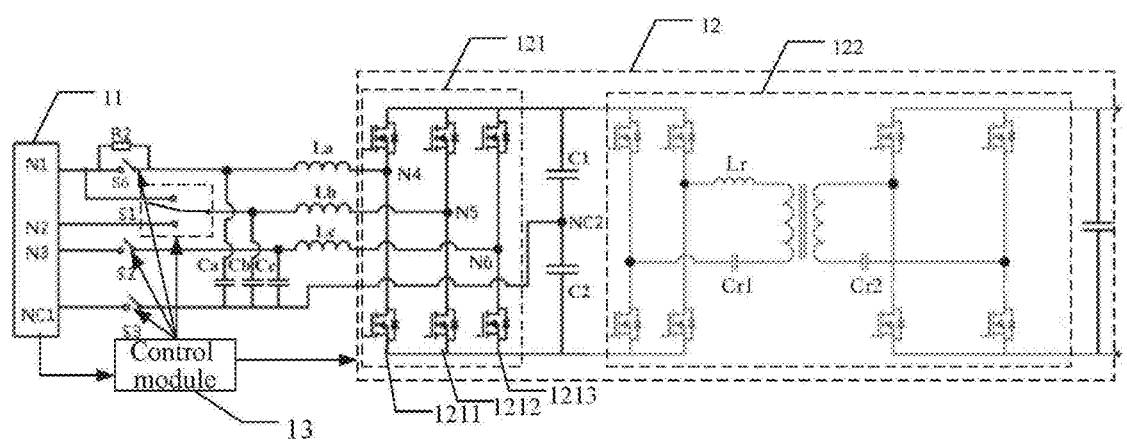

FIG. 5A and FIG. 5B are block diagrams of a circuit of the apparatus for charging and discharging according to an embodiment of the present disclosure.

With reference to FIG. 5A and FIG. 5B, in an exemplary embodiment of the present disclosure, the apparatus for charging and discharging further includes:

a sixth switch set S6, coupled to the control module 13, and including a first end and a second end, wherein the first end thereof is coupled to the first node N1, the second end thereof is coupled to the fourth node via a first inductance La, and the sixth switch set S6 is selectively turned on or turned off in response to a pre-charge control signal sent by the control module 13 according to a pre-charge requirement; and a second resistor R2 in parallel with the sixth switch set S6.

Although the second end of the first switch set S1 is directly coupled to the first node N1 in the embodiment shown in FIG. 5A and FIG. 5B, in other embodiments, when the apparatus for charging and discharging includes a sixth switch set S6, the second end of the first switch set S1 may also be coupled to the second end of the sixth switch set S6.

Figure 6:
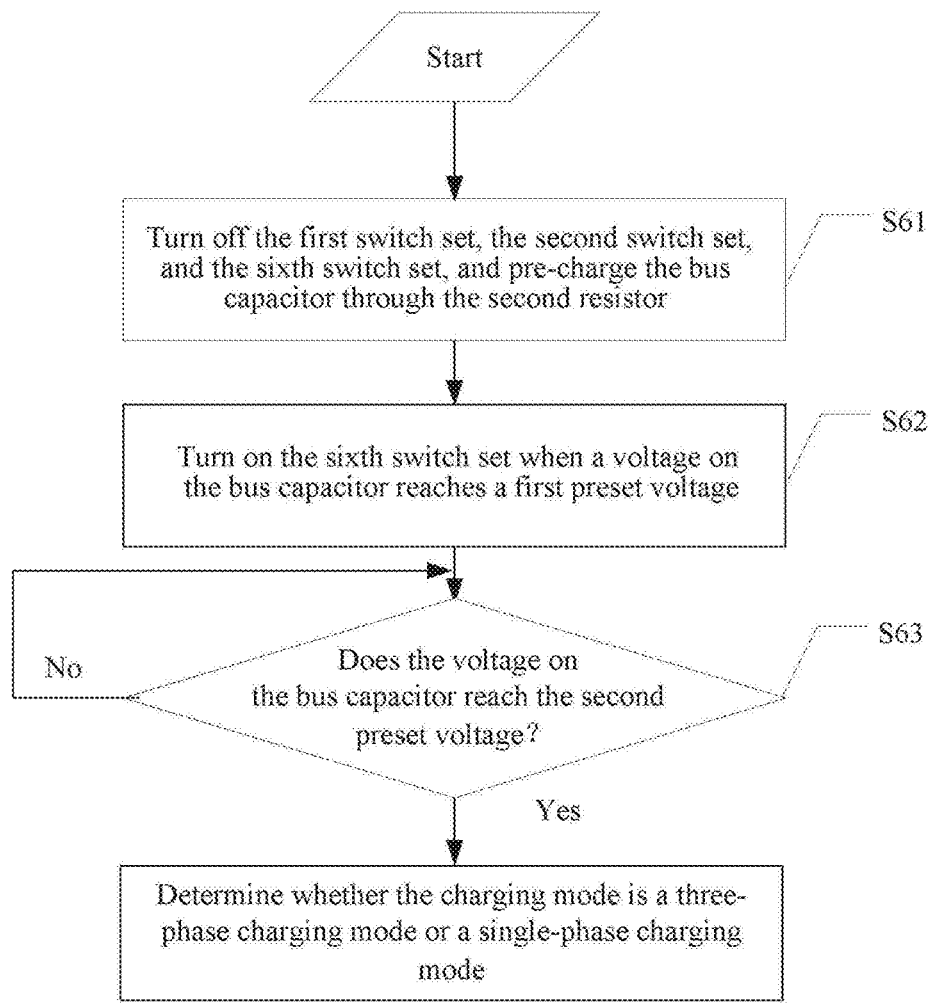
FIG. 6 is a flow chart of a method for charging and discharging corresponding to FIG. 5A and FIG. 5B according to an exemplary embodiment of the present disclosure.

FIG. 6 is a flow chart of a method for charging and discharging according to an embodiment of the present disclosure. The method for charging and discharging shown in FIG. 6 may be applied to the apparatus for charging and discharging shown in the FIG. 5A and FIG. 5B.

With reference to FIG. 6, before determining whether the operation mode is the three-phase mode or the single-phase mode, the method for charging and discharging 200 or 400 may further include:

step S61, turning off the first switch set, the second switch set, and the sixth switch set, and pre-charging the bus capacitor through the second resistor;

step S62, turning on the sixth switch set when a voltage on the bus capacitor reaches a first preset voltage; and step S63, jumping to step S21 or S41 after determining whether the charging mode is a three-phase charging mode or a single-phase charging mode when the voltage on the bus capacitor reaches a second preset voltage.

In the charging mode, the third switch set S3 may be firstly turned on to make the bus capacitors C1 and/or C2 to be pre-charged through the second resistor R2. When it is detected that the bus voltage reaches the first preset voltage V1, the sixth switch set S6 is turned on, and the current passes through the first node N1 and the fourth node N4 to charge the bus voltage to the second preset voltage V2. At this time, all the switch sets may be turned off, and the charging mode is determined to be the three-phase charging mode or the single-phase charging mode, and then the couple control of each switch set is controlled.

The circuit reliability can be effectively improved by setting the pre-charge circuit.

It should be noted that although several modules or units of apparatus for action execution are mentioned in the detailed description above, such division is not mandatory. In fact, features and functions of two or more of the modules or units described above may be embodied in one module or unit in accordance with the embodiments of the present disclosure. Conversely, the features and functions of one module or unit described above may be further divided into multiple modules or units.

Further, the above-described drawings are merely illustrative of the processes included in the method according to the exemplary embodiments of the present disclosure, and are not intended to be limiting. It is easy to understand that the processing shown in the above figures does not indicate or limit the chronological order of these processes. In addition, it is also easy to understand that these processes may be performed, for example, in a plurality of modules synchronously or asynchronously.

Other embodiments of the present disclosure will be apparent to those skilled in the art from consideration of the specification and practice of the present disclosure here. The present application is intended to cover any variations, uses, or adaptations of the present disclosure, which are in accordance with the general principles of the present disclosure and include common general knowledge or conventional technical means in the art that are not disclosed in the present disclosure. The specification and examples are to be considered as illustrative only, and the true scope and concept of the present disclosure is pointed out by the claims.

What is claimed is:

1. An apparatus for charging and discharging, comprising:
an AC power terminal, comprising a first node, a second node, a third node, and a first center line node, configured to receive an AC input or send an AC output;
a power conversion stage, comprising a fourth node, a fifth node, a sixth node, and a second center line node, the first node being coupled to the fourth node by a first inductor;
a first switch set, having a first end, a second end and a third end, the first end of the first switch set being coupled to the fifth node by a second inductor, the second end of the first switch set being coupled to the first node and the third end of the first switch set being coupled to the second node;
a second switch set, having a first end, a second end and a third end, the first end of the second switch set being coupled to the sixth node by a third inductor, the second end of the second switch set being coupled to the first node and the third end of the second switch set being coupled to the third node; and
a control module, coupled to the first switch set, the second switch set, the AC power terminal, and the power conversion stage.

2. The apparatus according to claim 1, wherein, the control module is configured to:
when the AC power terminal receives three-phase AC input or sends three-phase AC output, control the first end of the first switch set to be coupled to the third end of the first switch set and the first end of the second switch set to be coupled to the third end of the second switch set; and when the AC power terminal receives single-phase AC input or single-phase AC output, control the first end of the first switch set to be coupled to the second end of the first switch set, and control the first end of the second switch set to be disconnected with the third end of the second switch set.

3. The apparatus according to claim 1, further comprising:
a third switch set, coupled to the control module, having a first end and a second end, the first end of the third switch set being coupled to the first center line node, and the second end of the third switch set being coupled to the second center line node.

4. The apparatus according to claim 1, wherein, the first switch set and the second switch set comprises a single-pole double-throw switch, a double-pole double-throw switch, two semiconductor switches or two relays.

5. The apparatus according to claim 1, wherein, the power conversion stage comprises:
an AC/DC converter, comprising a first bridge arm coupled to the fourth node, a second bridge arm coupled to the fifth node, and a third bridge arm coupled to the sixth node, a first end of the first bridge arm, a first end of the second bridge arm, and a first end of the third bridge arm all being coupled to a seventh node, and a second end of the first bridge arm, a second end of the second bridge arm, and a second end of the third bridge arm all being coupled to an eighth node;
a first bus capacitor, coupled to the seventh node and the second center line node;
a second bus capacitor, coupled to the eighth node and the second center line node; and
a DC/DC converter, coupled to the seventh node and the eighth node.

6. The apparatus according to claim 5, wherein, the AC/DC converter and the DC/DC converter are bidirectional converter.

7. The apparatus according to claim 5, wherein, the DC/DC converter comprising a resonant circuit, the resonant circuit comprising a primary circuit, a resonant tank, and a secondary circuit, both the primary circuit and the secondary circuit are full bridge circuits, and the resonant tank comprises a transformer, at least one inductor and at least one capacitor.

8. The apparatus according to claim 1, wherein, the power conversion stage comprises:
an AC/DC converter, comprising a first bridge arm coupled to the fourth node, a second bridge arm coupled to the fifth node, and a third bridge arm coupled to the sixth node, a first end of the first bridge arm, a first end of the second bridge arm, and a first end of the third bridge arm all being coupled to the seventh node, and second ends of the first bridge arm, the second bridge arm, and the third bridge arm all being coupled to the eighth node;

a first bus capacitor, coupled to the seventh node and the second center line node;

a second bus capacitor, coupled to the eighth node and the second center line node;

a first DC/DC converter, in parallel with the first bus capacitor;

a second DC/DC converter, in parallel with the second bus capacitor.

9. The apparatus according to claim 8, wherein, the power conversion stage further comprises:

a switch bridge arm, in parallel with the second bus capacitor, comprising a first resistor and a fourth switch set that are coupled to each other, the fourth switch set being coupled to the control module, and being turned on or turned off in response to a first control signal formed by the control module according to an operation mode of the apparatus for charging and discharging; and a fifth switch set, coupled to the control module, having a first end, a second end and a third end, the first end of the fifth switch set being coupled to the first center line node, the second end of the fifth switch set being coupled to the sixth node or coupled to the sixth node by the third inductor, the third end of the fifth switch set being coupled to the second center line node, and the first end of fifth switch set being selectively coupled to the second end of the fifth switch set or the third end of the fifth switch set in response to a second control signal formed by the control module according to the operation mode of the apparatus for charging and discharging.

10. The apparatus according to claim 9, wherein, the fifth switch set comprises a single-pole double-throw switch, a double-pole double-throw switch, two semiconductor switches or two relays.

11. The apparatus according to claim 8, wherein, at least one of the first DC/DC converter and the second DC/DC converter is a bidirectional DC/DC converter and the AC/DC converter is a bidirectional AC/DC converter.

12. The apparatus according to claim 1, further comprising:

a sixth switch set, coupled to the control module and having a first end and a second end, the first end of the sixth switch set being coupled to the first node, the second end of the sixth switch set being coupled to the fourth node by the first inductor, and the sixth switch set being selectively turned on or turned off in response to a pre-charge control signal sent by the control module according to a pre-charge requirement; and a second resistor, in parallel with the sixth switch set.

13. A method for charging and discharging, applied to an apparatus for charging and discharging, wherein the apparatus for charging and discharging comprises: an AC power terminal, a first node, a second node, a third node, and a first center line node configured to receive an AC input or send AC output; a power conversion stage, comprising a fourth node, a fifth node, a sixth node, and a second center line node, the first node being coupled to the fourth node by a first inductor; a first switch set, having a first end, a second end and a third end, and the first end of the first switch set being coupled to the fifth node by a second inductor, the second end of the first switch set being coupled to the first node, and the third end of the first switch set being coupled to the second node; and a second switch set, having a first end, a second end and a third end, and the first end of the second switch set being coupled to the sixth node by a third inductor, the second end of the second switch set being coupled to the first node, and the third end of the second switch set being coupled to the third node; wherein, the method comprises:

determining whether an operation mode is a three-phase mode or a single-phase mode;

in the three-phase mode, controlling the first end of the first switch set to be coupled to the third end of the first switch set and the first end of the second switch set to be coupled to the third end of second switch set; and in the single-phase mode, controlling the first end of the first switch set of the apparatus for charging and discharging to be coupled to the second end of the first switch set, and controlling the first end of the second switch set to be disconnected with the third end of the second switch set.

14. The method according to claim 13, wherein, the power conversion stage comprises:

an AC/DC converter, comprising a first bridge arm coupled to the fourth node, a second bridge arm coupled to the fifth node, and a third bridge arm coupled to the sixth node, a first end of the first bridge arm, a first end of the second bridge arm, and a first end of the third bridge arm all being coupled to the seventh node, and a second end of the first bridge arm, a second end of the second bridge arm, and a second end of the third bridge arm all being coupled to the eighth node;

a first bus capacitor, coupled to the seventh node and the second center line node;

a second bus capacitor, coupled to the eighth node and the second center line node; and a DC/DC converter, coupled to the seventh node and the eighth node.

15. The apparatus according to claim 14, wherein, the AC/DC converter and the DC/DC converter are bidirectional converter.

16. The method according to claim 14, wherein, the DC/DC converter comprising a resonant circuit, the resonant circuit comprising a primary circuit, a resonant tank, and a secondary circuit, both the primary circuit and the secondary circuit are full bridge circuits, and the resonant tank comprises a transformer, at least one inductor and at least one capacitor.

17. The method according to claim 13, wherein, the apparatus for charging and discharging further comprises a third switch set coupled to the first center line node and the second center line node.

18. The method according to claim 13, wherein, the first switch set and the second switch set comprises a single-pole double-throw switch, a double-pole double-throw switch, two semiconductor switches or two relays.

19. The method according to claim 13, wherein, the power conversion stage comprises: a first bridge arm coupled to the fourth node, a second bridge arm coupled to the fifth node, a third bridge arm coupled to the sixth node, a seventh node coupled to a first end of the first bridge arm, a first end of the second bridge arm, and a first end of the third bridge arm, an eighth node coupled to a second end of the first bridge arm, a second end of the second bridge arm, and a second end of the third bridge arm, a first bus capacitor coupled to the seventh node and the second center line node, a second bus capacitor coupled to the eighth node and the second center line node, a first DC/DC converter in parallel with the first bus capacitor, a second DC/DC converter in parallel with the second bus capacitor.

20. The method according to claim 19, wherein, the power conversion stage further comprises: a switch bridge arm in parallel with the second bus capacitor, wherein the switch bridge arm comprises a first resistor and a fourth switch set coupled to each other, the fourth switch set is coupled to the control module, the apparatus for charging and discharging further comprises: a fifth switch set coupled to the control module and having a first end, a second end and a third end, and the first end of the fifth switch set is coupled to the first center line node, the second end of the fifth switch set being coupled to the sixth node or coupled to the sixth node by the third inductor, the third end of the fifth switch set being coupled to the second center line node, wherein the method comprises:

in a three-phase mode, controlling the fourth switch set to be turned off, and controlling the first switch set and the second switch set according to an operation mode of the apparatus for charging and discharging; and in a single-phase mode, controlling the fourth switch set to be turned on, controlling a front stage of the second DC/DC converter to be conducted after a preset time, and controlling the first switch set and the second switch set according to the operation mode of the apparatus for charging and discharging.

21. The method according to claim 19, further comprising:

in the three-phase mode, controlling the first end of the fifth switch set to be coupled to the third end of the fifth switch set; and in the single-phase charging mode or the single-phase discharging mode, controlling the first end of the fifth switch set to be coupled to the second end of the fifth switch set.

22. The method according to claim 13, wherein the apparatus for charging and discharging further comprises: a sixth switch set and a second resistor connected in parallel with the sixth switch set, wherein the sixth switch set has a first end and a second end, the first end of the sixth switch set is coupled to the first node, the second end of the sixth switch set being coupled to the fourth node by the first inductor, and a capacitor formed by the first bus capacitor and the second bus capacitor connected in series is a bus capacitor; wherein, before determining whether the charging mode is the three-phase mode or the single-phase mode, the method further comprises:

disconnecting the first end of the first switch set with the second end and the third end of the first switch, the first end of the second switch set with the second end and the third end of the second switch set, and turning off the sixth switch set, and pre-charging the bus capacitor by the second resistor;

turning on the sixth switch set when a voltage on the bus capacitor reaches a first predetermined voltage; and determining whether the charging mode is the three-phase charging mode or the single-phase charging mode when the voltage on the bus capacitor reaches a second preset voltage.

\* \* \* \* \*